US006511239B1

(12) United States Patent
Kretschmann et al.

(10) Patent No.: US 6,511,239 B1
(45) **Date of Patent: *Jan. 28, 2003**

(54) FLYER DETERMINATION AND ELIMINATION FOR SIDE EDGE ELECTRONIC REGISTRATION

(75) Inventors: Deborah M. Kretschmann, Penfield, NY (US); Dean Thomas, Webster, NY (US); Ming Yang, Fairport, NY (US); Robert Brutovski, Penfield, NY (US)

(73) Assignee: Xerox Corporation, Stamford, CT (US)

( * ) Notice: Subject to any disclaimer, the term of this patent is extended or adjusted under 35 U.S.C. 154(b) by 125 days.

This patent is subject to a terminal disclaimer.

(21) Appl. No.: 09/714,564

(22) Filed: Nov. 17, 2000

(51) Int. Cl.[7] .......................... B41J 11/42; B41J 2/385; G03G 15/00; B65H 5/00; H01L 27/00

(52) U.S. Cl. ...................... 400/579; 400/578; 399/394; 347/129; 271/2; 250/208

(58) Field of Search ......................... 400/579; 399/394; 347/129; 271/2; 250/208

(56) References Cited

U.S. PATENT DOCUMENTS 4,538,905 A 9/1985 Griego et al. ........... 355/14 SH
5,563,685 A * 10/1996 Onthank ...................... 355/75
5,887,996 A * 3/1999 Castelli et al. .............. 400/579
5,994,711 A 11/1999 Seachman et al. ..... 250/559.36
6,137,989 A * 10/2000 Quesnel ...................... 399/394
6,327,458 B1 * 12/2001 Chapman .................... 399/394
6,342,909 B1 * 1/2002 Joichi et al. ................ 347/129
6,373,042 B1 * 4/2002 Kretschmann et al. ... 250/208.1
6,374,075 B1 * 4/2002 Benedict et al. ............ 399/395

* cited by examiner

*Primary Examiner*—Andrew H. Hirshfeld
*Assistant Examiner*—Marvin P Crenshaw
(74) *Attorney, Agent, or Firm*—William F. Eipert; Paul F. Daebeler

(57) ABSTRACT

The present invention generally relates to a printing apparatus including a marking device, the marking device being capable of placing an image on a sheet fed therein, and outputting the sheet; a feed path, by which sheets are fed from a sheet supply to the marking device; a duplex path, by which sheets output from the marking device are re-fed to the marking device; a first sensor, outputting a first position signal relating to a location of a side edge as each sheet passes through the feed path; a second sensor, outputting a second position signal relating to a location of a side edge as each sheet passes through the duplex path; and an image placement controller associated with the marking device, the image placement controller retaining first position signals for a plurality of sheets passing through the feed path and second position signals for a plurality of sheets passing through the duplex path, and calculating new average paper positions for each sheet in response to at least one of the first position signals and the second position signals.

16 Claims, 5 Drawing Sheets

FLYER DETERMINATION AND ELIMINATION FOR SIDE EDGE ELECTRONIC REGISTRATION

INCORPORATION BY REFERENCE

The present specification incorporates by reference U.S. Pat. No. 5,994,711 and U.S. patent application Ser. No. 09/649,645.

FIELD OF THE INVENTION

The present invention relates to office equipment such as printers and copiers, and in particular relates to a system for detecting and eliminating flyers, which are sheets deviating from the designed side edge position in a center or side registered paper path system.

BACKGROUND OF THE INVENTION

Office equipment, such as printers and copiers, which place images based on digital data onto sheets, such as sheets of paper, are well known. More sophisticated types of office equipment are capable of placing images on both sides of a single sheet of paper, a feature often referred to as "duplexing." A typical configuration of a duplexing printer (the word "printer" including other types of equipment, such as digital copiers and facsimile machines) will include a marking device, meaning some hardware which places a desired image on a sheet, which is capable of printing only on one side of the sheet at a time. In order to print on both sides of the same sheet, it is necessary to feed a sheet through the marking device the first time, so the sheet can receive a first image on one side thereof, and then invert the sheet and re-feed it back into the marking device so that the marking device can place a second image on the other side of the sheet. Although the specific architectures of various office equipment on the market varies widely, the path (along with any associated sheet-handling hardware, such as belts or rollers and motors) by which a sheet which has been output by the marking device is inverted and re-fed to the marking device can be generally referred to as a "duplex path."

To properly place an image onto sheets, the sheets must be precisely registered. Occasionally in a center or side registered paper path system, a sheet will stray from the designed side edge position in the path. The undesirable result of these "flyers" is side edge mis-registration of the image on the sheet. Historically, the approach has been to improve the paper path performance in an attempt to prevent the "flyers". Unfortunately, not all outside influences can be designed out of the system. As a result, flyers continue to occur and cause customer dissatisfaction with side edge registration. Therefore, there is a need to eliminate the flyers caused by outside influences.

SUMMARY OF THE INVENTION

In one embodiment of the present invention, a printing apparatus includes a marking device, the marking device being capable of placing images on sheets fed therein, and outputting the sheets; a feed path, by which sheets are fed from a sheet supply to the marking device; a first sensor, outputting a first position signal relating to a location of a side edge as each sheet passes through the feed path; and an image placement controller associated with the marking device, the image placement controller determining whether each sheet is a flyer based on the first position signal. The marking device includes a charge receptor or an ink-jet printhead. The printing apparatus further includes a duplex path, by which sheets output from the marking device are re-fed to the marking device; and a second sensor, outputting a second position signal relating to a location of a side edge as each sheet passes through the duplex path, wherein the image placement controller associated with the marking device determines whether a sheet is a flyer based on at least one of the first position signal and second position signal.

The printing apparatus includes a marking device, the marking device being capable of placing an image on a sheet fed therein, and outputting the sheet; a feed path, by which sheets are fed from a sheet supply to the marking device; a duplex path, by which sheets output from the marking device are re-fed to the marking device; a first sensor, outputting a first position signal relating to a location of a side edge as each sheet passes through the feed path; a second sensor, outputting a second position signal relating to a location of a side edge as each sheet passes through the duplex path; and an image placement controller associated with the marking device, the image placement controller retaining first position signals for a plurality of sheets passing through the feed path and second position signals for a plurality of sheets passing through the duplex path, and calculating new average paper positions for each sheet in response to at least one of the first position signals and the second position signals. The new average paper position of each sheet is calculated based on whether the sheet is a flyer or the preceding sheet is a flyer. The marking device includes a charge receptor or ink-jet printhead.

A method for determining and eliminating flyers in a printing apparatus, including measuring each sheet position at a first sensor, wherein the first sensor outputs first position signal to a controller; determining sheet position and sheet variance based on first position signal; comparing sheet variance to a running average sheet variance to determine whether the sheet is a flyer; and calculating new average sheet position based on said comparison for marking images on sheets. The method for determining and eliminating flyers in a printing apparatus, further includes measuring each sheet position at a second sheet sensor, wherein the second sensor outputs second position signal to the controller; determining sheet shift position and sheet shift variance based on first position signal and second position signal; comparing sheet shift variance to a running average sheet shift variance to determine whether the sheet is a flyer; and calculating new average sheet shift position based on said comparison for marking images on sheets.

DESCRIPTION OF THE PREFERRED EMBODIMENTS

Figure 1:
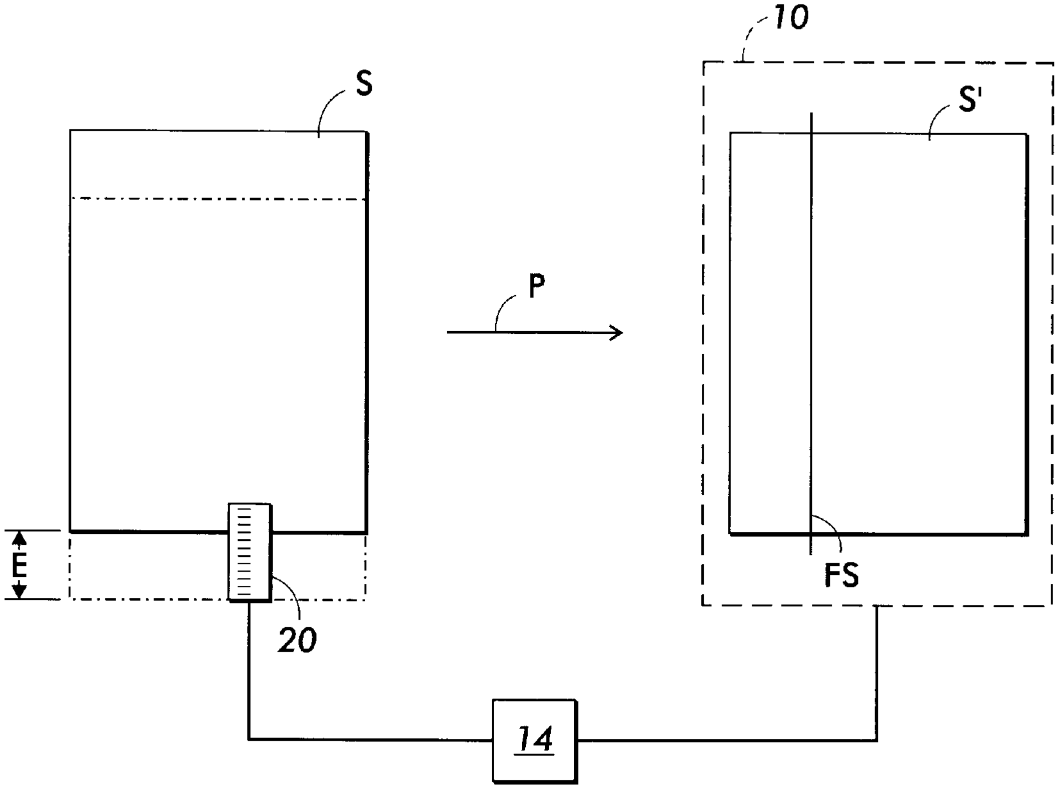
FIG. 1 PRIOR ART
FIG. 1 is a diagram showing the basic principles of edge registration for sheets being fed into a marking device, as known in the prior art.

FIG. 1 is a diagram showing the basic principle of edge registration of a sheet within a printer, as used with the present invention. A sheet S is sent through a path in a process direction indicated as P toward a marking device generally indicated as 10. At a short interval before the sheet is fed through marking device 10 to receive an image thereon, the sheet is caused to pass over, in one particular embodiment, an optical sensor 20, which functions, in terms of the claims below, as an "edge position detector." There are many possible designs of an optical (or mechanical) sensor 20 and associated system in the art which are capable of determining the position of the side edge of the sheet, but the preferred embodiment of such a sensor is given in U.S. Pat. No. 5,994,711.

The purpose of optical sensor 20 is to determine the precise location of a "side edge" of the sheet S relative to a fixed point within the printer, such as indicated by the distance E. Consistent with the claims below, as used in the specification herein, the edge of the sheet which runs parallel to the process direction P will be referred to as the "side edge" of the sheet, even if the particular image placed on the sheet causes the "side edge" of the fed sheet to be the top edge or bottom edge relative to the image printed thereon. The optical sensor 20 determines the precise distance E of the edge of the sheet S relative to some fixed point within the machine, and the determination of this distance E is output by a sensor 20 as an "edge position signal," as the term is used in the claims below (such a signal may be in any form, such as a digital number). In brief, the edge position signal from a particular sensor 20 is symbolic of the measured position of a side edge of the sheet being fed through a path in a process direction.

The edge position signal from sensor 20 is sent to a control system or image placement controller generally indicated as 14, which influences the operation of the marking device 10. Marking device 10 can be of any type known in the art, such as an electrophotographic "laser printer" device, or can alternately be an ink jet printer with a reciprocating printhead, or an ink jet printer with a page wide printhead. In the case in which marking device 10 is an electrophotographic device, it is typical that the image desired to be printed, which is originally rendered as digital image data, is ultimately placed on the sheet by means of a narrow laser beam which corresponds to a "fast scan direction" FS which is perpendicular to process direction P. An electrophotographic marking device 10 can respond to the edge position signal from sensor 20 by coordinating its "start of scan" signal, meaning the precise time at which a leading edge of a raster line in an image to be printed starts to create an image, in order to maintain a precise spacing relative to the location of the edge of a sheet, such as when the sheet is receiving an image at the location marked S'.

In the case of an ink jet marking device with a relatively small printhead which reciprocates along fast scan direction FS shown in the FIG. 1, the signal from a sensor 20 can be used to determine the exact timing of the beginning of the printhead ejections with each printhead scan, once again to ensure a precise placement of the printed image relative to the edge of the sheet. In the case of an ink jet printer (or equivalent device, such as an ionographic head) which includes a printhead which extends the full width of a page, the edge position signal from sensor 20 can be used to determine the exact subset of the ejectors or ejector equivalents which are used to create the image on the sheet S.

Although the description in FIG. 1 shows the basic case in which the exact location of the edge of a sheet is determined by sensor 20, and the information derived therefrom is used for precise placement of an image on the same sheet when the sheet is passed through the marking device 10, it will be apparent that variations on the basic concept are possible. For example, instead of determining the position of the edge of a particular sheet and thereby adjusting the image placement of the image on that particular sheet, it may be more practical to place an image on a particular sheet based on data about the edge locations of sheets which have been previously fed through the path. For instance, it may be desirable to maintain a running average of the positions of previous sheets which have been fed through the path, and use information from previous sheets for the placement of images on subsequent sheets; this general concept rests on the reasonable assumption that a sheet running through the path at a particular time will behave very similarly to a subsequent sheet moving through the path. However, as discussed above, occasionally a sheet will substantially stray from this running average. This sheet is referred to as a "flyer."

Figure 2:
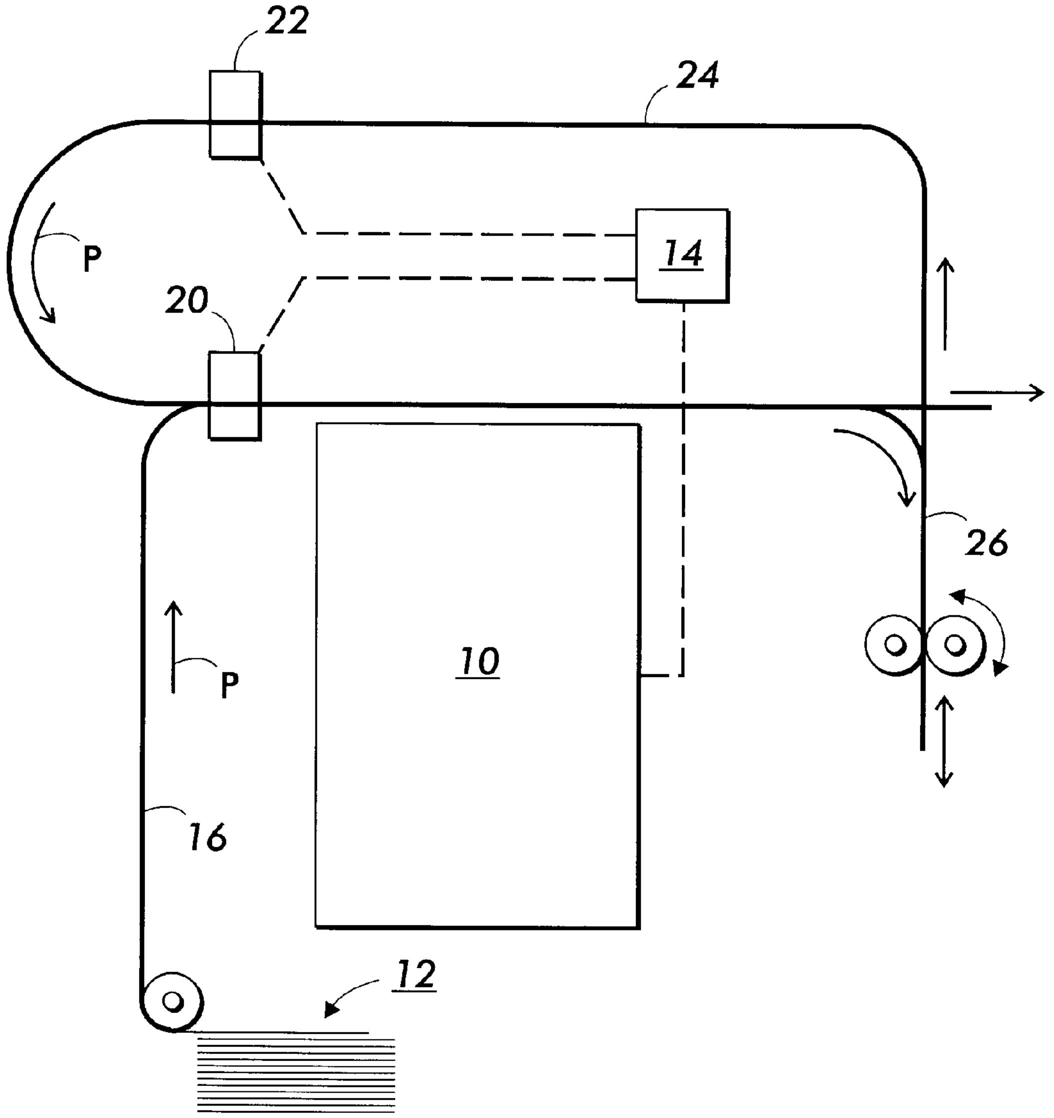
FIG. 2 is a simplified elevational view of the relevant portions of a printing apparatus, such as a digital printer or copier having a duplex path, and incorporating the present invention.

FIG. 2 is a simplified elevational view of the relevant portions of a digital printing apparatus, including a duplex path, incorporating the present invention. As in FIG. 1, there is provided a marking device 10, which is, in relevant part, controlled by an image placement controller 14. Sheets on which one or more images are desired to be printed are drawn from a sheet supply stack 12, of a design known in the art, and caused to move through a feed path 16. In addition to a sensor 20 forming an edge position detector, feeding a signal into image placement controller 14, there is preferably provided a second sensor 22 forming a second image position detector. The second edge position detector 22 is disposed along a duplex path indicated as 24. Sheets traveling along the feed pass 16 are initially sent through marking device 10 to receive an image on at least one side thereof. For purposes of the claims herein, terms such as "feed path" and "duplex path" are intended to include not only the space defined for passage of sheets there through, but also any necessary hardware to cause motion of the sheets for the feed path or duplex path, such as rollers, vacuum transports, belts, diverters, etc. Also, even though the term "duplex path" is used for convenience in some of the claims below, it will be understood that an equivalent of such a duplex path will be apparent in any machine in which a sheet is re-fed through a marking device 10 for any reason, such as to receive a second image thereon (even on the same side thereof).

Disposed along the duplex path 24, in the particular illustrated embodiment, is what can generally be called an "inverter" 26. As is generally known in the art, the function of inverter 26 is in effect to flip over a particular sheet, so that a second side of the sheet can be re-fed to the marking device 10 for placing the second image thereon. The general architecture of a feed path and duplex path shown in FIG. 2 is generally familiar from the Xerox® Document Centre™ 265, which became publicly available in 1997, although other architectures, such as including trays for temporarily storing sheets until they are re-fed, are known in the art.

With particular reference to the present invention, optical sensor 20 acts as an edge position detector for sheets approaching the marking device 10 through feed path 16, while optical sensor 22 acts as an edge position detector for sheets passing through duplex path 24. Sheets passing through duplex path 24 are typically those sheets which have already been printed on one side thereof by marking device 10, and then inverted in inverter 26, to be sent back to marking device 10 through duplex path 24. Thus, in general, every sheet passing through duplex path 24 will already have thereon one image on a first side thereof, and is approaching marking device 10 to receive a second image on the second, opposite side thereof. The image placement controller 14 responds to signals from both optical detectors 20, 22, and uses this information to control the placement of images on sheets by marking device 10 as taught by U.S. patent application Ser. No. 09/649,645.

Figure 3:
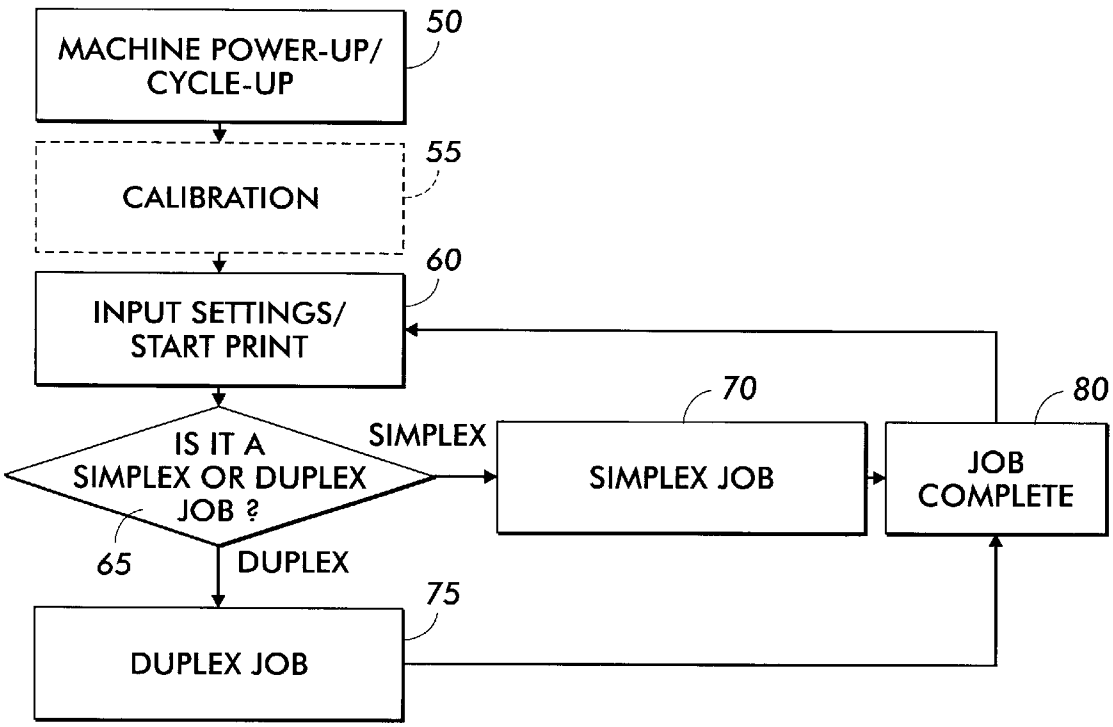
FIGS. 3–5 are flow charts showing the method steps of the present invention.
Figure 4:
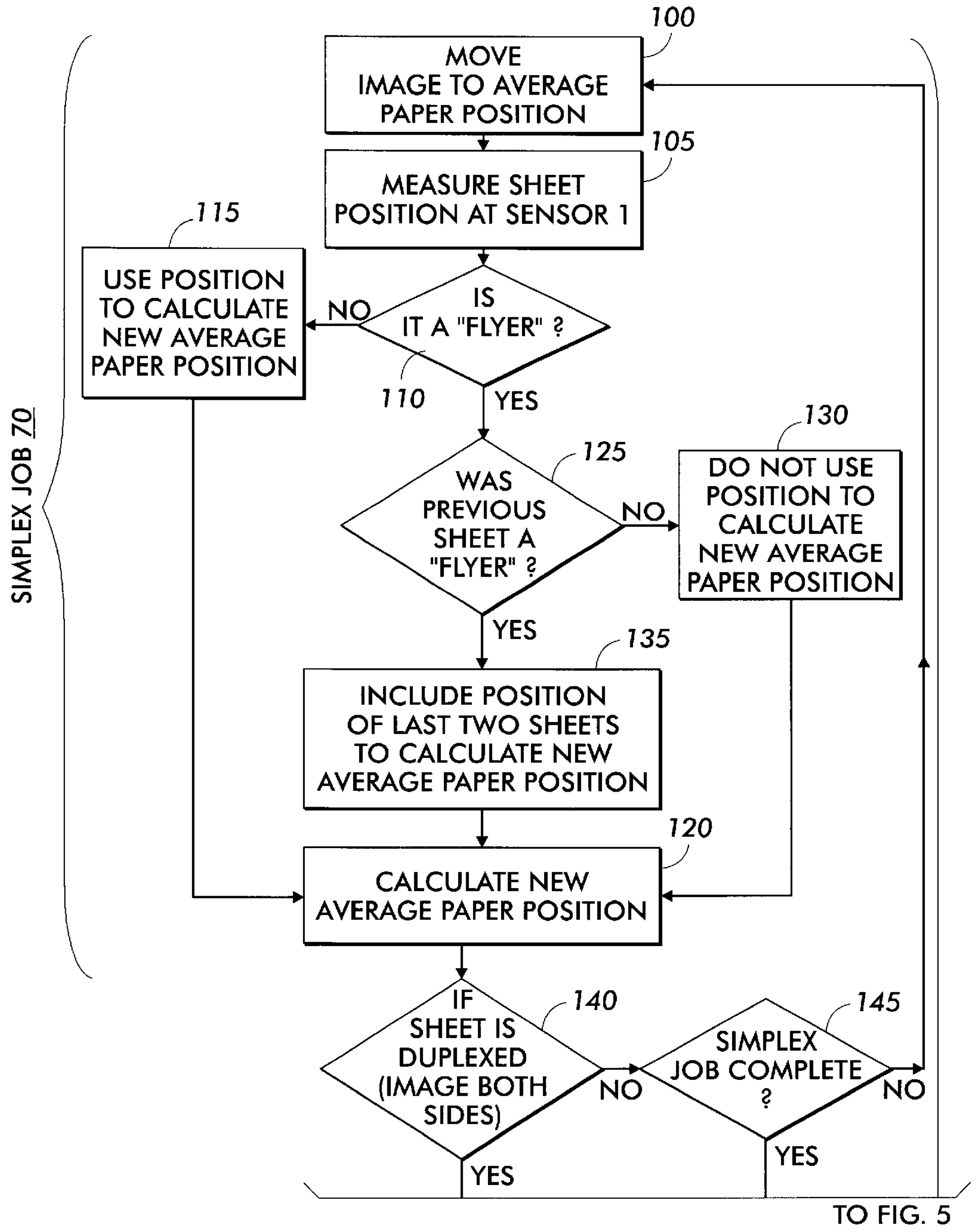
Figure 5:
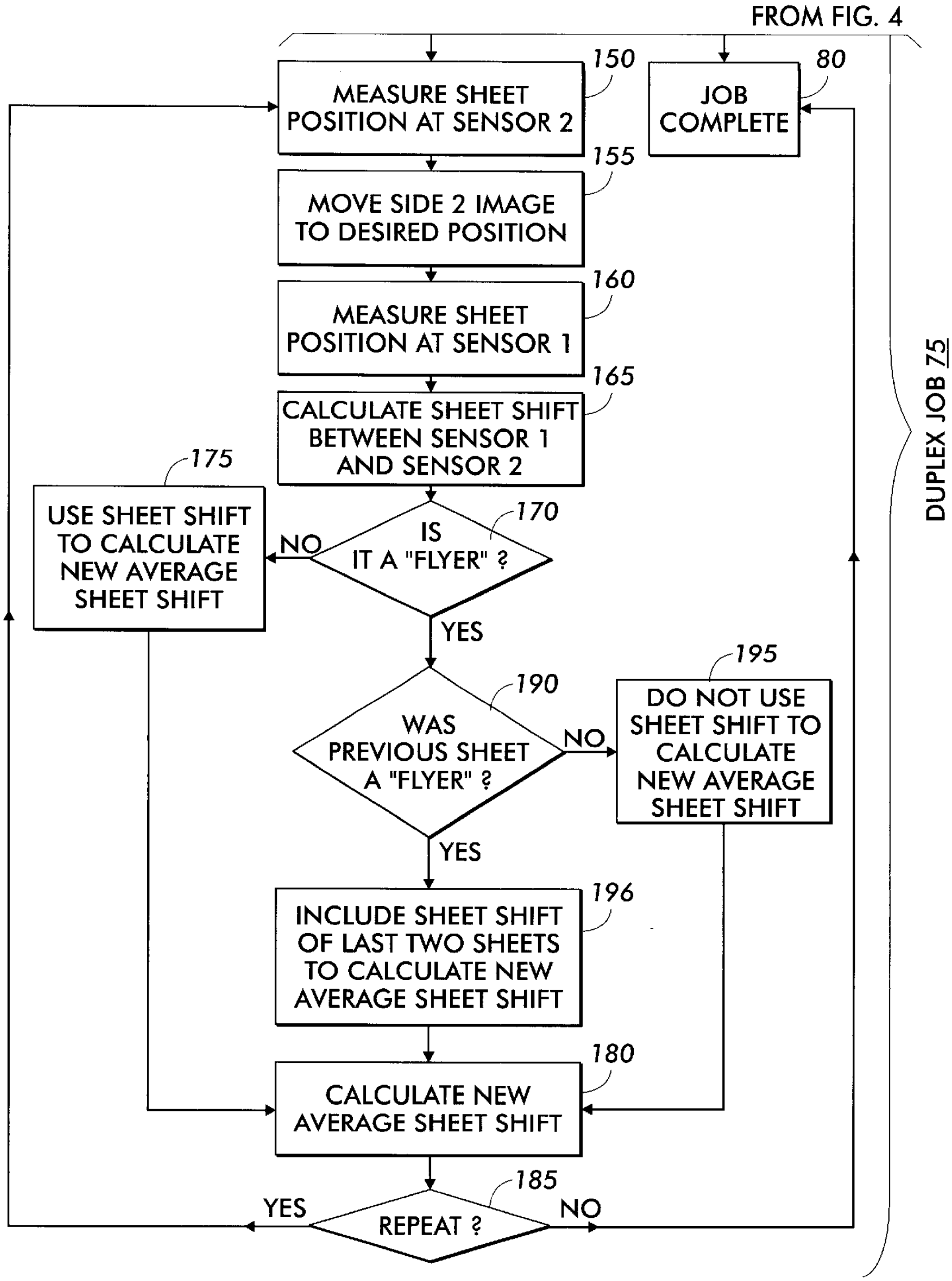

According to the present invention, the image placement controller 14 determines and eliminates flyers based on historical data, statistical computations and signals received from optical detector 20 (sensor 1) and/or optical detector 22 (sensor 2). FIGS. 3–5 generally show the preferred methods of eliminating flyers in accordance with the present invention. After the printer is powered up (50) and calibrated (55) (if required), the operator inputs settings including simplex and duplex depending on the desired print job. There may be a default setting of simplex. The printing is started by an operator using a button or graphical user interface, or printing is started when a command is received from an operator by way of a computer or by way of a network (60).

The command may include settings such as simplex or duplex. If the setting or command is simplex (65), then the simplex path for the simplex job (70) is selected. Alternatively, if the setting or command is duplex (65), then the duplex path for the duplex job (75) is selected. Once the print job is completed (80), then an operator may adjust the settings and start another print job (60).

FIG. 4 shows the flyer detection and elimination process when simplex job 70 is selected and FIGS. 4–5 show the flyer elimination and detection process when the duplex job 75 is selected. Based on history of previous sheet positions as taught by U.S patent application Ser. No. 09/649,645, an image is moved into position (100). The position of a sheet in the paper path is measured by optical detector 20 or sensor 1 (105). One or more electrical signals indicating the position of the sheet are transmitted to controller 14.

Controller 14 determines whether the sheet is a flyer (110), and thereafter if elimination of the measurement is required in accordance with the present invention. The elimination of flyers is also referred to as a noise filter.

In accordance with the present invention, the printer maintains a running average (running mean) paper position and a running average variance based on sensor 1 measurements. For example, the controller 14 calculates the running average paper position and running average variance based on the measurements supplied by sensor 1. The running average variance may be closely approximated by the average of the squares of the registration errors. Controller 14 compares the running average variance (e.g. variance of the last N sheets from the running average paper position of the last N sheets) with the variance of the N+1 sheet to determine whether the N+1 sheet (current or present sheet) is a flyer. For example, the N+1 sheet is a flyer if the square of the registration error of the N+1 sheet is greater than product of the average of the squares of the registration errors (running average variance) and the square of a safety cut factor (k) for the standard deviations (preferably the safety cut factor k will be 2 or 3 if we choose to use 2 or 3 times the standard deviation $\sigma$ as the acceptable range).

$$\text{variance} = [\Sigma\text{square of reg error from } 1{:}N]/N \qquad \text{Equation (1)}$$

$$\text{If } (|\text{reg error of present sheet}|^2) > (k^2)(\text{variance}) \text{ then present sheet is a flyer} \qquad \text{Equation (2)}$$

(Note: $k^2=4$ if using $2\sigma$, or 9 if using $3\sigma$ as the acceptable range).

If the current sheet is not a flyer (110), then the position of current sheet as measured by sensor 1 is included to calculate a new running average paper position (115). Therefore, the measurements and calculated values based on the N+1 sheet become the measurement and calculated values of the N sheet. The measurements and calculated values of the oldest previous sheet are dropped so that the new calculations are based on the most recent measurements and data. The new average paper position is calculated in step 120.

If the current sheet (N+1) is a flyer (110), then elimination of this sheet's measured position is considered. If the previous sheet N was not a flyer (125), then the controller 14 does not use the measured position of sheet N+1 to calculate a new running average (running mean) paper position (130). Instead, the new running average paper position will be the same as the current running average paper position. (The currently measured paper position is still stored temporarily in memory. If the next sheet is not a flyer, then this measured paper position will be eliminated as part of steps 115 and 120 to provide the new average paper position).

However, if the previous sheet was a flyer (125), then the measured position and calculated values of both the previous sheet and the measured position and calculated values of the N+1 sheet are included in determining a new running average paper position (135). The new running average paper position is calculated (120). Since the controller 14 recognizes that the job is simplex or duplex, the controller 14 will recognize when sheets from a simplex job are not to be duplexed (140) and the controller 14 will determine whether the simplex job is completed (145). If the simplex job is completed then the controller 14 returns to job complete (80). If the simplex job is incomplete, then the controller returns to handling the next page (100). The above steps 100–145 are repeated until the simplex job is completed (145 and 80).

If the print job is a duplex job (75), then the controller 14 will recognize each sheet as a duplex sheet. After a duplex sheet has completed steps 100–140, the duplex sheet is detected and measured at optical detector 22 (sensor 2) (150). The side 2 image is moved to the desired position (155). For example, the side 2 image may be moved on top of the side 1 image as taught by U.S. patent application Ser. No. 09/649,645. The position of the duplex sheet at optical detector 20 (sensor 1) is then measured (160). Controller 14 calculates the sheet shift between sensor 1 and sensor 2 (165). Sheet shift is defined as the difference between the side edge position as measured by optical detector 22 (sensor 2) and the side edge position as measured by optical detector 20 (sensor 1) or how much the sheet moves in the side edge direction as it travels between sensor 2 and sensor 1. (Side edge direction is perpendicular to the process direction P as shown to in FIG. 1). Controller 14 determines whether the sheet is a flyer (170), and thereafter eliminates the flyer in accordance with the present invention.

In accordance with the present invention, the printer maintains a running average sheet shift and a running average sheet shift variance based on sensor 1 and sensor 2 measurements. For example, the controller 14 calculates the running average sheet shift and running average sheet shift variance based on the measurements supplied by sensor 1 and sensor 2. The running average sheet shift variance may be closely approximated by the average of the squares of the sheet shift. Controller 14 compares the running average sheet shift variance (e.g. variance of the last N sheets from the running average sheet shift of the last N sheets) with the sheet shift variance of the N+1 sheet to determine whether the N+1 sheet (current or present sheet) is a flyer. For example, the N+1 sheet is a flyer if the square of the sheet shift of the N+1 sheet is greater than product of the average of the squares of the sheet shifts (running average sheet shift variance) and the square of a safety cut factor (k) for the standard deviations (preferably the safety cut factor k will be 2 or 3 if we choose to use 2 or 3 times the standard deviation σ as the acceptable range).

sheet shift variance=[Σsquare of sheet shift from 1:N]/N Equation (3)

If (|sheet shift of present sheet|$^2$)>($k^2$)( sheet shift variance) then present sheet is a flyer Equation (4)

(Note: $k^2=4$ if using 2σ, or 9 if using 3σ as the acceptable range).

If the current sheet is not a flyer (175), then the sheet shift measured by sensor 1 and sensor 2 is included to calculate a new running average sheet shift (175). Therefore, the measurements and calculated values based on the N+1 sheet become the measurement and calculated values of the N sheet. The measurements and calculated values of the oldest previous sheet are dropped so that the new calculations are based on the most recent measurements and data. The new average sheet shift is calculated in step 180.

If the current sheet (N+1) is a flyer (170), then elimination of this sheet's measured position is considered. If the previous sheet N was not a flyer (190), then the controller 14 does not use the sheet shift of sheet N+1 to calculate a new running average sheet shift (195). Instead, the new running average sheet shift will be the same as the current running average sheet shift. (The present sheet shift is still stored temporarily in memory. If the next sheet is not a flyer, then this sheet shift will be eliminated as part of steps 175 and 180 to provide the new sheet shift).

However, if the previous sheet was a flyer (190), then the sheet shift of both the previous sheet and the N+1 sheet are included in determining a new running average sheet shift (196). The new running average sheet shift is calculated (180). Steps 150–180 are repeated (185) as each new duplex sheet is received from steps 100–140 until all the duplex job is completed (80).

While the invention has been described in detail with reference to specific and preferred embodiments, it will be appreciated that various modifications and variations will be apparent to the artisan. All such modifications and embodiments as may occur to one skilled in the art are intended to be within the scope of the appended claims.

What is claimed is:

1. A printing apparatus, comprising:

a marking device, the marking device being capable of placing images on sheets fed therein, and outputting the sheets;

a feed path, by which sheets are fed from a sheet supply to the marking device;

a first sensor, outputting a first position signal relating to a location of a side edge as each sheet passes through the feed path; and an image placement controller associated with the marking device, the image placement controller determining whether each sheet is a flyer based on the first position signal and a running average of the positions of previous sheets which have been fed through the feed path.

2. The apparatus of claim 1, wherein the marking device includes a charge receptor.

3. The apparatus of claim 1, wherein the marking device includes an ink-jet printhead.

4. The printing apparatus as in claim 1, further comprising:

a duplex path, by which sheets output from the marking device are re-fed to the marking device; and a second sensor, outputting a second position signal relating to a location of a side edge as each sheet passes through the duplex path, wherein the image placement controller associated with the marking device determines whether a sheet is a flyer based on at least one of the first position signal and second position signal.

5. The apparatus of claim 4, wherein the marking device includes a charge receptor.

6. The apparatus of claim 4, wherein the marking device includes an inkjet printhead.

7. A printing apparatus, comprising:

a marking device, the marking device being capable of placing an image on a sheet fed therein, and outputting the sheet;

a feed path, by which sheets are fed from a sheet supply to the marking device;

a duplex path, by which sheets output from the marking device are re-fed to the marking device;

a first sensor, outputting a first position signal relating to a location of a side edge as each sheet passes through the feed path;

a second sensor, outputting a second position signal relating to a location of a side edge as each sheet passes through the duplex path; and an image placement controller associated with the marking device, the image placement controller retaining first position signals for a plurality of sheets passing through the feed path and second position signals for a plurality of sheets passing through the duplex path, and calculating new average paper positions for each sheet in response to at least one of the first position signals and the second position signals.

8. The printing apparatus as in claim 7, wherein the new average paper position of each sheet is calculated based on whether the sheet is a flyer or the preceding sheet is a flyer.

9. The apparatus of claim 7, wherein the marking device includes a charge receptor.

10. The apparatus of claim 7, wherein the marking device includes an ink-jet printhead.

11. A method for determining and eliminating flyers in a printing apparatus, comprising:

measuring each sheet position at a first sensor, wherein the first sensor outputs first position signal to a controller;

determining sheet position and sheet variance based on first position signal;

comparing sheet variance to a running average sheet variance to determine whether the sheet is a flyer; and calculating new average sheet position based on said comparison for marking images on sheets.

12. The method for determining and eliminating flyers in a printing apparatus as in claim 11, further comprising:

measuring each sheet position at a second sheet sensor, wherein the second sensor outputs second position signal to the controller;

determining sheet shift position and sheet shift variance based on first position signal and second position signal;

comparing sheet shift variance to a running average sheet shift variance to determine whether the sheet is a flyer; and calculating new average sheet shift position based on said comparison for marking images on sheets.

13. The method for determining and eliminating flyers in a printing apparatus as in claim 12, wherein the step of calculating new average sheet shift position, comprises:

if the sheet is a flyer, identifying whether an immediately previous sheet passing the second sensor was determined to be a flyer and, if so, calculating the new average sheet shift position from the sheet shift position, a shift position of the previous sheet passing the second sensor and a predetermined number of shift positions of sheets which passed the second sensor.

14. The method for determining and eliminating flyers in a printing apparatus as in claim 11, wherein the step of calculating new average sheet position, comprises:

if the sheet is a flyer, identifying whether an immediately previous sheet passing the first sensor was determined to be a flyer and, if so, calculating the new average sheet position from the sheet position, a position of the previous sheet passing the first sensor and a predetermined number of positions of previous sheets which have been measured at the first sensor.

15. A system for determining and eliminating flyers in a printing apparatus, comprising:

a sensor for measuring sheet position, wherein the sensor outputs a position signal; and a controller receiving the position signal, the controller determining sheet position and sheet variance based on the position signal, comparing sheet variance to a running average sheet variance to determine whether the sheet is a flyer, and calculating new average sheet position based on said comparison for marking images on sheets.

16. The system for determining and eliminating flyers in a printing apparatus as in claim 15, further comprising:

a second sheet sensor for measuring sheet position, wherein the second sensor outputs a second position signal to the controller;

wherein the controller further determines sheet shift position and sheet shift variance based on the position signal and the second position signal, compares sheet shift variance to a running average sheet shift variance to determine whether the sheet is a flyer, and calculates new average sheet shift position based on said comparison for marking images on sheets.

* * * * *